US010727855B2

(12) United States Patent
Sugiyama

(10) Patent No.: US 10,727,855 B2
(45) Date of Patent: Jul. 28, 2020

(54) ANALOG-TO-DIGITAL CONVERSION APPARATUS

(71) Applicant: CASIO COMPUTER CO., LTD., Tokyo (JP)

(72) Inventor: Junichi Sugiyama, Akishima (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 16/286,940

(22) Filed: Feb. 27, 2019

(65) Prior Publication Data

US 2019/0296759 A1    Sep. 26, 2019

(30) Foreign Application Priority Data

Mar. 22, 2018  (JP) .................................. 2018-053999

(51) Int. Cl.
*H03M 1/12* (2006.01)
*H03M 1/36* (2006.01)

(52) U.S. Cl.
CPC ....... *H03M 1/1245* (2013.01); *H03M 1/1215* (2013.01); *H03M 1/36* (2013.01)

(58) Field of Classification Search
USPC ....................................................... 341/141
See application file for complete search history.

(56) References Cited

U.S. PATENT DOCUMENTS

| | | | | | |
|---|---|---|---|---|---|
| 5,617,090 | A * | 4/1997 | Ma | .................. | H03M 3/474 341/141 |
| 6,507,298 | B1 * | 1/2003 | Barrenscheen | ........... | G06F 3/05 341/141 |
| 6,788,235 | B1 * | 9/2004 | Barrenscheen | ......... | H03M 1/12 341/155 |
| 7,420,498 | B2 * | 9/2008 | Barrenscheen | ........... | G06F 3/05 341/155 |
| 7,817,076 | B2 * | 10/2010 | Drummy | .............. | G01N 29/262 341/141 |
| 9,000,962 | B1 * | 4/2015 | Leuciuc | .............. | H03M 1/1033 341/120 |
| 2011/0102221 | A1 * | 5/2011 | Guido | ................. | H03M 1/1225 341/141 |

FOREIGN PATENT DOCUMENTS

| | | |
|---|---|---|
| JP | S63-244129 A | 10/1988 |
| JP | 8-330969 A | 12/1996 |
| JP | 2010-251842 A | 11/2010 |

OTHER PUBLICATIONS

JPO; Application No. 2018-053999; Notice of Reasons for Refusal dated Jan. 28, 2020.

* cited by examiner

*Primary Examiner* — Howard Williams
(74) *Attorney, Agent, or Firm* — Fitch, Even, Tabin & Flannery LLP

(57) ABSTRACT

An analog-to-digital conversion apparatus includes a controller. The controller is configured to execute first control processing to cause the selection circuit of each of the circuit sets to perform switching which involves cyclically changing an analog signal to be selected at sampling timings with a predetermined time difference, and second control processing to calculate a digital data item at a reference sampling timing for each of the analog signals based on digital data items obtained from the analog-to-digital converter of the plurality of circuit sets, in accordance with the digital data items with the predetermined time difference, the sampling timings, and the time difference.

6 Claims, 4 Drawing Sheets

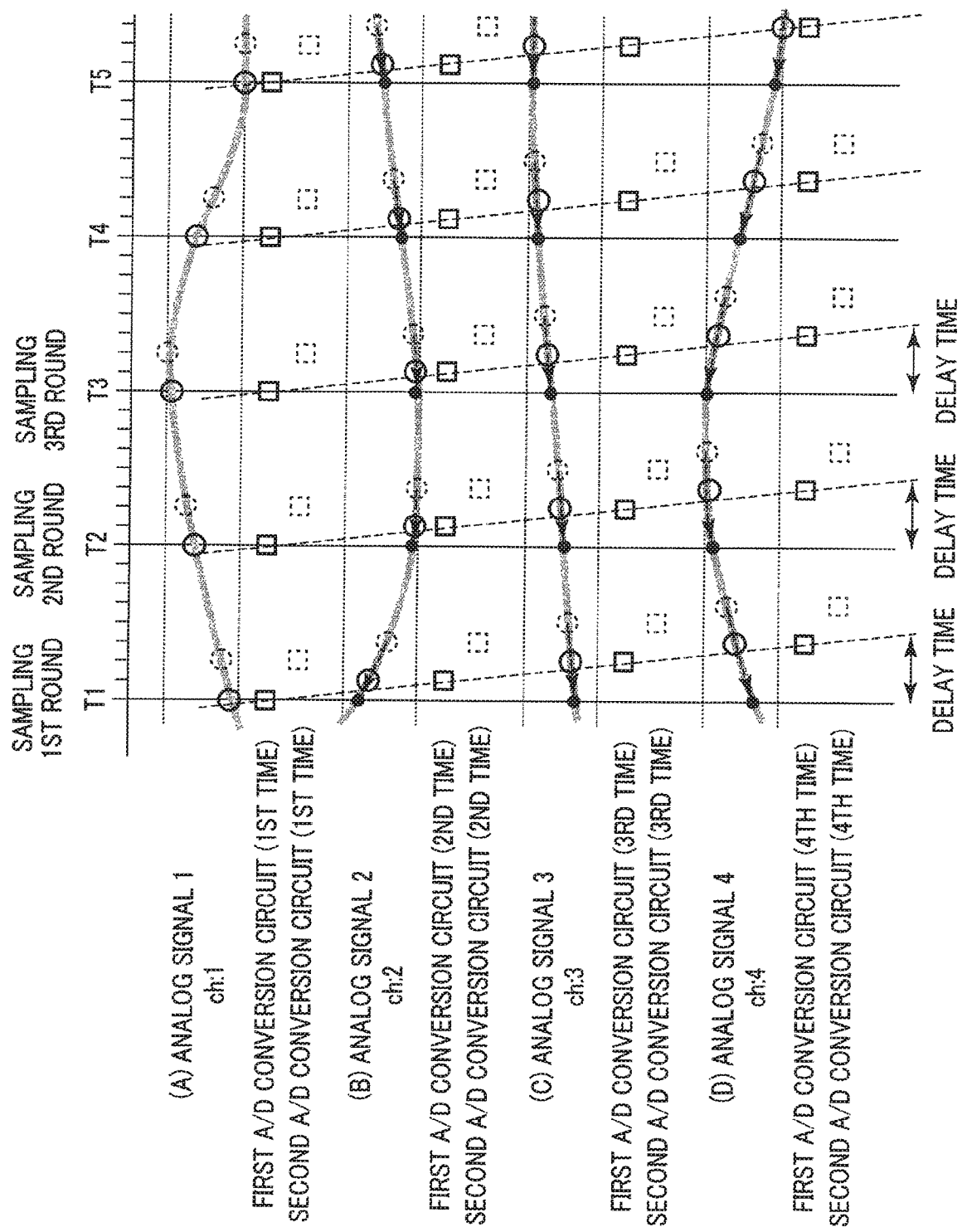
F I G. 3

ANALOG-TO-DIGITAL CONVERSION APPARATUS

CROSS-REFERENCE TO RELATED APPLICATIONS

This application is based upon and claims the benefit of priority from Japanese Patent Application No. 2018-053999, filed Mar. 22, 2018, the entire contents of which are incorporated herein by reference.

BACKGROUND OF THE INVENTION

1. Field of the Invention

The present invention relates to an analog-to-digital conversion apparatus suitable for a multichannel analog-to-digital converter or the like.

2. Description of the Related Art

A technique for increasing conversion throughput of a sigma-delta analog-to-digital converter has been proposed (for example: Jpn. Pat. Appln. KOKAI Publication No. 8-330969).

SUMMARY OF THE INVENTION

According to one aspect of the present invention, there is provided an analog-to-digital conversion apparatus. The analog-to-digital conversion apparatus comprises a plurality of circuit sets, each including a selection circuit configured to select and output one of three or more input analog signals, and an analog-to-digital converter configured to convert the analog signal output from the selection circuit to digital data, the circuit sets being fewer in number than the input analog signals; and a controller. The controller is configured to execute: first control processing to cause the selection circuit of each of the circuit sets to perform switching which involves cyclically changing an analog signal to be selected at sampling timings with a predetermined time difference, and second control processing to calculate a digital data item at a reference sampling timing for each of the analog signals based on a plurality of digital data items obtained from the analog-to-digital converter of the plurality of circuit sets, in accordance with the digital data items with the predetermined time difference, the sampling timings, and the time difference.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a diagram illustrating an example of processing timings in a case of sampling analog signals 1 to 4 by two analog-to-digital conversion circuits according to the embodiment.

DETAILED DESCRIPTION OF THE INVENTION

An analog-to-digital conversion apparatus according to an embodiment of the present invention will now be described in detail with reference to the accompanying drawings.

Figure 1:
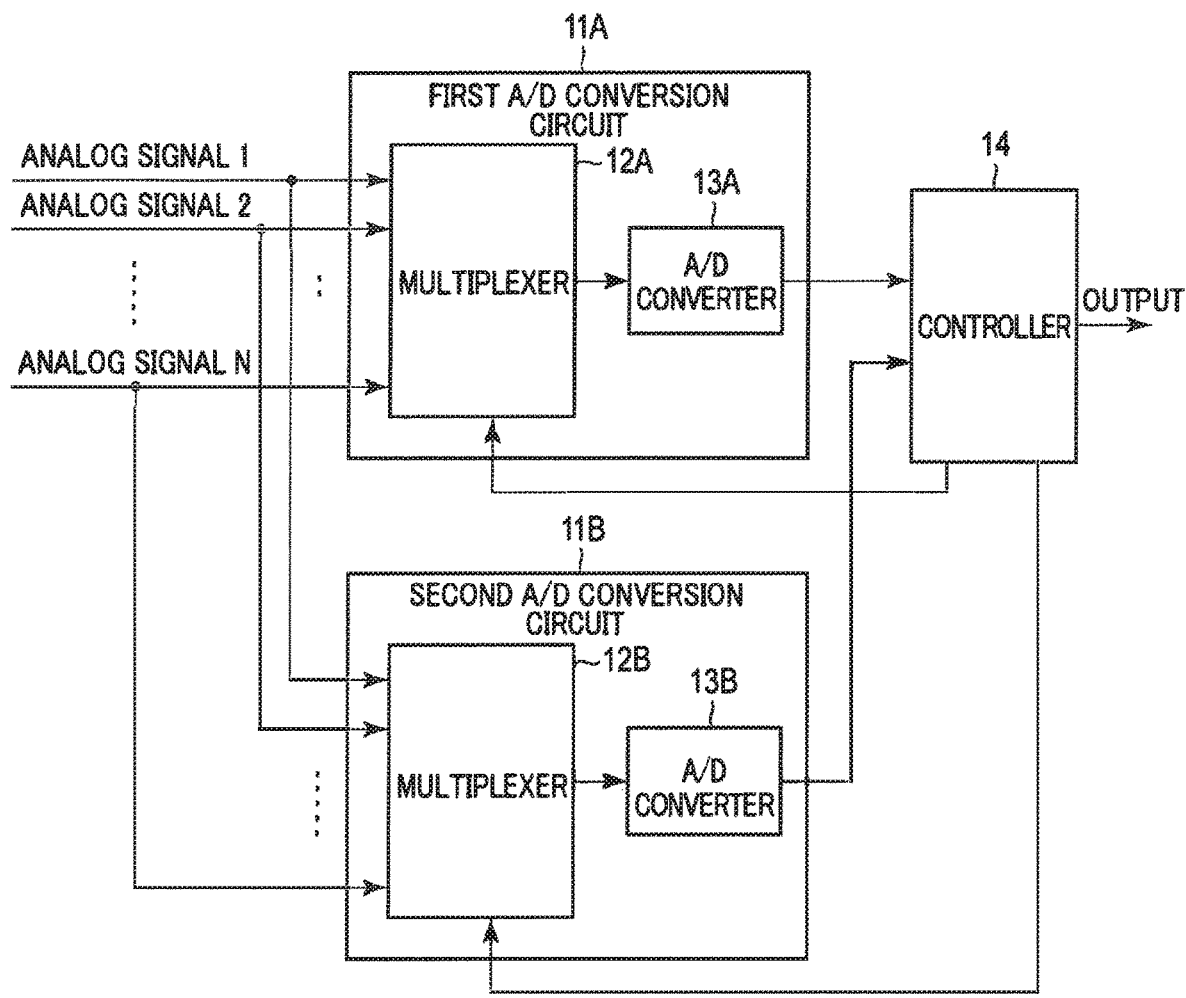
FIG. 1 is a block diagram illustrating a circuit configuration of an analog-to-digital conversion apparatus according to an embodiment of the present invention.

FIG. 1 is a block diagram showing a circuit configuration of the analog-to-digital conversion apparatus according to the embodiment. In the diagram, a plurality of, for example, 1 to N analog signals are supplied to two analog-to-digital conversion circuits 11A and 11B in parallel.

The analog-to-digital conversion circuits 11A and 11B are circuit sets, each including a multiplexer 12A (12B) and an analog-to-digital converter 13A (13B). An analog signal selected by the multiplexer 12A (12B) is output to the analog-to-digital converter 13A (13B).

The analog-to-digital converter 13A (13B) converts the analog signal selected by the multiplexer 12A (12B) to digital data of a predetermined quantization bit rate, and outputs the digital data to a controller 14.

The controller 14 incorporates a processor, a program memory storing an operation program to be executed by the processor, and a work memory.

The controller 14 instructs the multiplexers 12A and 12B of the respective analog-to-digital conversion circuits 11A and 11B to cyclically switch between analog signals, which the multiplexers select at each sampling timing with a predetermined time difference, so that the sampling times of the sampling of the analog signals selected by the multiplexers may not overlap.

The controller 14 receives the digital data supplied from the analog-to-digital conversion circuits 11A and 11B, calculates digital data at sampling timing as a reference (reference sampling timing) for each of the original analog signals, and continuously outputs the calculated digital data.

This embodiment includes, for example, the two analog-to-digital conversion circuits 11A and 11B as shown in FIG. 1; however, the number of analog-to-digital conversion circuits is not limited to this example. The minimum number of analog-to-digital conversion circuits is two; three or more analog-to-digital conversion circuits may be used, as long as they number less than the total of analog signals that are simultaneously input.

Next, operations of the above embodiment will be described.

Figure 2:
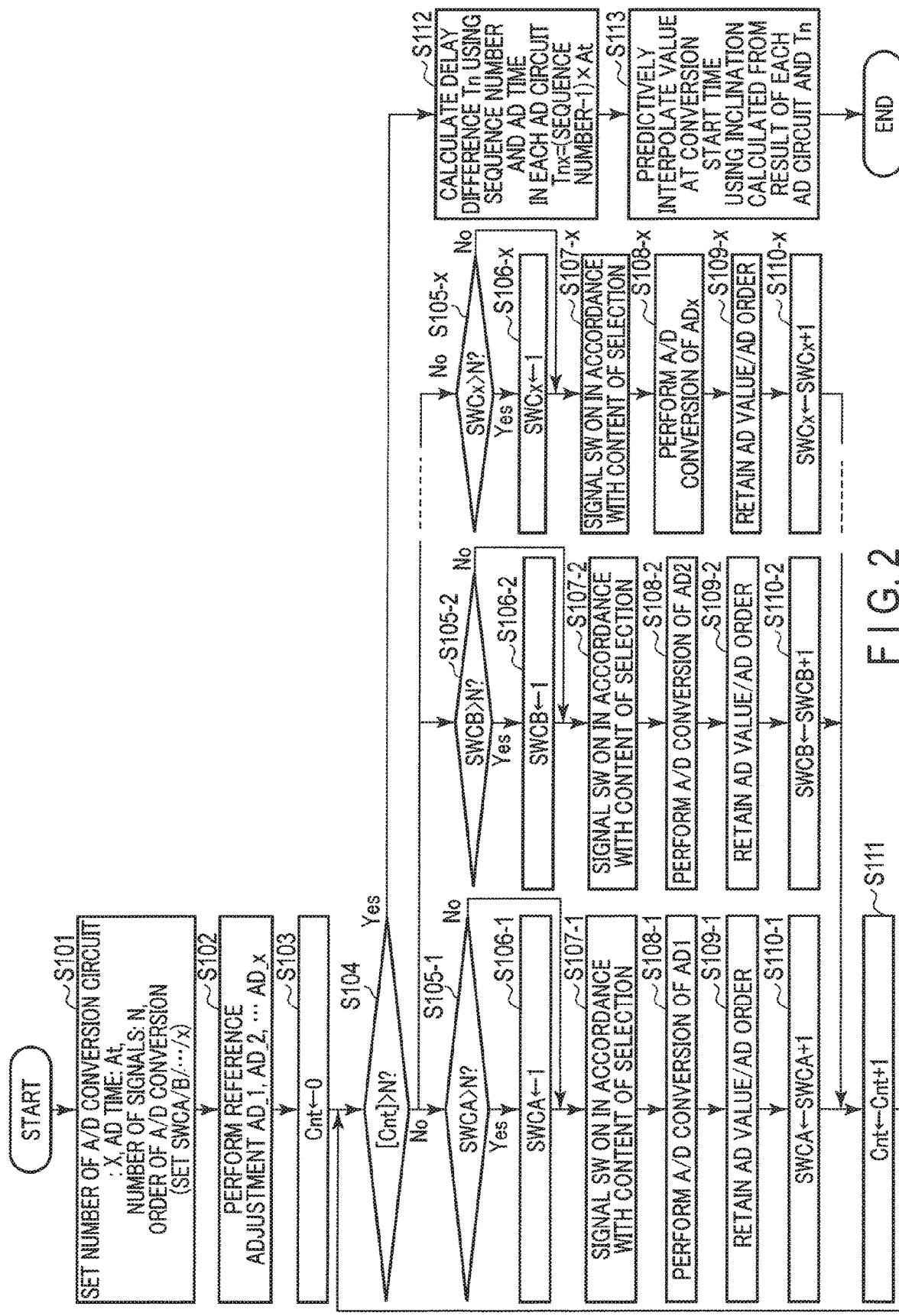
FIG. 2 is a flowchart illustrating processing contents executed by a controller according to the embodiment.

FIG. 2 shows contents of the operation control of the analog-to-digital conversion apparatus executed mainly by the controller 14.

At the beginning of the processing, variables are set as initial settings; that is, the number of analog-to-digital conversion circuits: X ("2" in this embodiment), AD time: At, the number of analog signals: N, and order of analog-to-digital conversion for the N analog signals (order of switching of signal switches SWCA1 to SWCAx (SWCB1 to SWCBx) in the multiplexer 12A (12B)) (step S101).

The AD time At is a delay error time that occurs in each sampling; in other words, a sampling cycle.

It is assumed that analog-to-digital conversion for the N analog signals is performed in the following order, for example: In the multiplexer 12A of the analog-to-digital conversion circuit 11A, the signal switch SWCA1 is turned on first, and the signal switch SWCA2 is turned on second, so that the analog signal 1 is sampled at the first sampling timing and the analog signal 2 is sampled at the second sampling timing. Subsequently, the signal switches are turned on one by one at every sampling timing, thereby shifting the analog signals to be sampled from one to another. When the analog signal N is sampled, the signal switch SWCA1 is turned on again. Thus, the signal switches are cyclically turned on.

In the analog-to-digital conversion circuit 11B, the signal switches SWCB1 to SWCBx of the multiplexer 12B are turned on at sampling timing with a predetermined time difference from the switching in the analog-to-digital conversion circuit 11A, and in the same order as in the case of the analog-to-digital conversion circuit 11A.

Thereafter, the controller 14 causes all analog-to-digital conversion circuits, in this embodiment, both the analog-to-digital conversion circuits 11A and 11B, to temporarily select the same analog signal at the same sampling timing, and compares the digital data. If there is a difference in digital data, the controller 14 performs reference adjustment processing by adjusting one of the analog-to-digital conversion circuits to make both conversion results the same (step S102).

Thus, the preparation before normal operation is completed, and an initial value "0" is set to a counter (Cnt) to indicate that sampling of all analog signals has made a round (step S103).

Thereafter, the controller 14 determines whether or not necessary sampling has made a round based on whether or not the counter value exceeds the number N of analog signals (step S104).

If the counter value does not exceed the number N of analog signals and the controller 14 determines that the necessary sampling has not made a round (No in step S104), the controller 14 causes each of the analog-to-digital conversion circuits 11A and 11B to execute sampling of analog signals.

Steps S105-S110 described below are sampling processing performed for the analog-to-digital conversion circuits 11A and 11B in parallel under the control of the controller 14.

In this embodiment, the two analog-to-digital conversion circuits 11A and 11B are described as an example. Steps S105-1 to S110-1 in FIG. 2 are executed in the analog-to-digital conversion circuit 11A, and steps S105-2 to S110-2 are executed in the analog-to-digital conversion circuit 11B.

In the following, the processing of steps S105-1 to S110-1 executed in the analog-to-digital conversion circuit 11A will be described. The processing of steps S105-2 to S110-2 executed in the analog-to-digital conversion circuit 11B is the same as that in the analog-to-digital conversion circuit 11A, except that the sampling is performed at sampling timing with a predetermined time difference from the sampling in the analog-to-digital conversion circuit 11A. Therefore, the explanation for the analog-to-digital conversion circuit 11B is omitted.

In the analog-to-digital conversion circuit 11A, it is determined whether the content selected by the signal switch SWCA, that causes the multiplexer 12A to select an analog signal at that time, is set to exceed the maximum number N of analog signals (step S105-1).

This is the determination for the results of updating the content selected by the signal switch SWCA in steps S105-1 to S110-1 executed in the previous sampling operation time.

In this step, to realize cyclic sampling of analog signals only when it is determined that the content selected by the signal switch SWCA exceeds the maximum number N of analog signals (Yes in step S105-1), the controller 14 resets the content selected by the signal switch SWCA to "SWCA1" (step S106-1).

In step S105-1, if it is determined that the content selected by the signal switch SWCA does not exceed the maximum value N of analog signals (No in step S105-1), the processing in step S106-1 is not performed as that is now unnecessary.

Thereafter, the signal switch SWCA is set to ON in accordance with the content selected at that time (step S107-1) to cause the multiplexer 12A to select an analog signal. The analog signal selected by the multiplexer 12A is sampled by the analog-to-digital converter 13A and converted to digital data (step S108-1.)

The controller 14 retains the digital data obtained from the analog-to-digital converter 13A, along with information on the sampling order at that time, that is, the sequence number of sampling timing counted from the start of sampling as reference sampling timing (step S109-1).

Then, the content selected by the signal switch SWCA is updated to be incremented by "+1" (step S110-1).

Thus, in both of the analog-to-digital conversion circuits 11A and 11B, the contents selected by the signal switches SWCA and SWCB are updated. Thereafter, the value of the counter (Cnt) is updated to be incremented by "+1" (step S111), the process returns to step S104, and similar processing is repeated.

The processing from step S104 to S111 is repeated by the number of times corresponding to the number of analog signals, and all analog signals are converted by both the analog-to-digital conversion circuits 11A and 11B to digital data at sampling timings with a predetermined time difference.

Then, if it is determined in the next step S104 that the value of the counter (Cnt) exceeds the number N of the analog signals and that the necessary sampling has made a round (Yes in step S104), the controller 14 calculates a delay difference Tn based on the orders of analog-to-digital conversion performed by the analog-to-digital conversion circuits 11A and 11B, set in step S101, and the AD time At (step S112).

Assuming that the first sampling timing is a reference sampling timing, the delay difference Tnx in the x-th analog-to-digital conversion circuit is given by the following equation:

$$Tnx=(\text{Number in sequence of sampling timing}-1) \times At$$

The controller 14 predictively interpolates digital data with respect to the original analog signals 2 to N at the sampling timing when the first analog signal (analog signal 1) is analog-to-digital converted (reference sampling timing to be described later), using the digital data obtained by the analog-to-digital conversion circuits 11A and 11B and the inclination calculated from the delay difference Tn (step S113).

When digital data corresponding to the analog signals 1 to N at the reference sampling timing is obtained, the controller 14 temporarily ends the processing shown in FIG. 2 and outputs the digital data to a circuit (not shown) in the subsequent stage.

FIG. 3 is a diagram illustrating an example of processing timing in a case of sampling analog signals 1 to 4, represented by (A) to (D), by the two analog-to-digital conversion circuits 11A and 11B. In the diagram, solid line circles represent sampling timings of the analog-to-digital conversion circuit 11A, and broken line circles represent sampling timings of the analog-to-digital conversion circuit 11B. In the first and subsequent rounds of sampling, first sampling timings T1, T2, T3, . . . are reference sampling timings, respectively.

The analog-to-digital conversion circuit 11A samples the analog signals 1, 2, 3, 4, . . . in this order. The analog-to-digital conversion circuit 11B samples the analog signals 1, 2, 3, 4, . . . in this order with a predetermined time difference (delayed by two sampling timings) relative to the analog-to-digital conversion circuit 11A.

Therefore, with respect to digital data for the same analog signal, the digital data at the reference sampling timing can be obtained on the assumption of a straight line having an inclination which connects the digital data obtained by the analog-to-digital conversion circuit 11B and the digital data obtained by the analog-to-digital conversion circuit 11A, at two timings prior to the sampling timing of the analog-to-digital conversion circuit 11B, and by calculating the digital data when the straight line passes the last reference timing by predictive interpolation as indicated by the broken line arrow in the diagram.

In the setting described above, since the analog-to-digital conversion circuit 11A obtains digital data corresponding to the analog signal 1 indicated by (A) in FIG. 3 on time, the predictive interpolation described above is unnecessary.

Figure 4:
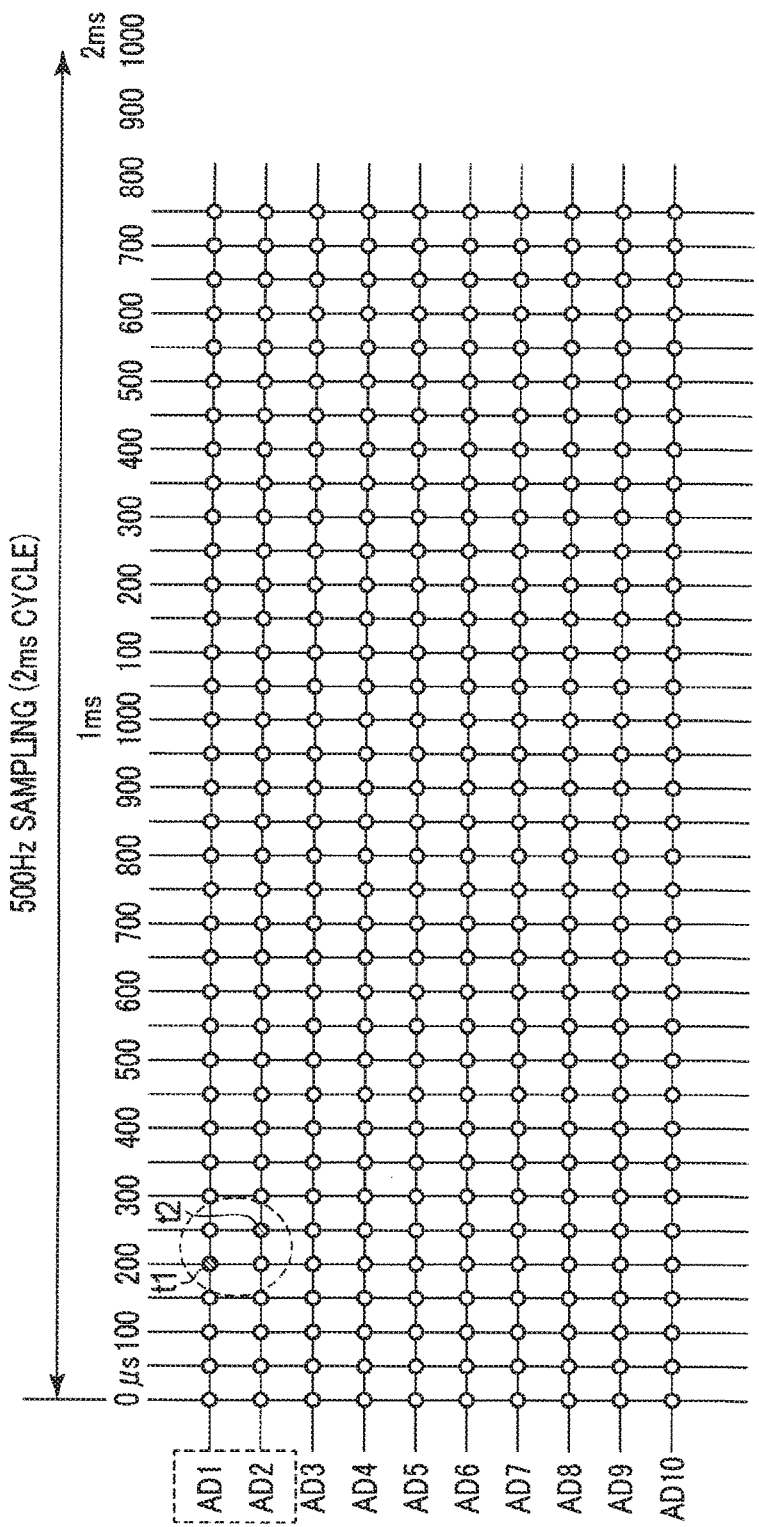
FIG. 4 is a diagram illustrating an example of sampling timings of ten analog-to-digital conversion circuits at different settings according to the embodiment.

FIG. 4 shows another example of sampling timing of setting different from that described above. In this example, ten analog-to-digital conversion circuits (AD1 to AD10) are used to convert analog signals 1 to 100 output from 100 sensors at sampling frequency of 500 [Hz] (cycle of 2 [ms]).

In this case, one AD time At of each analog-to-digital conversion circuit is 50 [µs]. In the diagram, assuming that the reference sampling timing is 0 [µs], if digital data corresponding to an analog signal obtained by an analog-to-digital conversion circuit AD1 at timing t1 of 200 [µs] is "100", and digital data corresponding to the same analog signal obtained by an analog-to-digital conversion circuit AD2 at timing t2 of 250 [µs] is "102", digital data corresponding to the same analog signal at the reference sampling timing of 0 [µs] is estimated to be "92".

In the embodiment described above, digital data at the reference sampling timing is calculated by linear predictive interpolation simply from the digital data obtained at two sampling timings. Accordingly, the digital data at the reference sampling timing can be calculated with less burden required for processing in the controller 14.

Furthermore, depending on characteristics of various sensors which are used in practice, the following conditions may be set, for example:
an upper limit of digital data;
a lower limit of digital data;
an upper limit of a degree of change (inclination) per unit time;
a range of a cycle of variation of an analog signal; and
a pattern of variation of an analog signal.

The prediction accuracy can be increased by setting digital data at the reference timing by setting the above conditions.

According to the embodiment described in detail above, the influence of a conversion delay time can be eliminated, while the multichannel analog-to-digital conversion system is adopted.

Therefore, the circuit size and the power consumption for analog-to-digital conversion, required due to the multichannel system, can be drastically reduced, while a number of digital data outputs can be obtained at the same sampling timing.

In the above description of embodiment, it is assumed that sampling clocks of the two AD analog-to-digital conversion circuits 11A and 11B are synchronized; however, the sampling clocks may not be necessarily synchronized.

The present invention is not limited to the above-described embodiment, and can be modified in various manners in practice when implementing the invention without departing from the spirit of the invention. Embodiments can be combined as appropriate if possible. In that case, combinational effects can be obtained. In addition, the above-described embodiment includes inventions of various stages, and a variety of inventions can be derived by properly combining structural elements disclosed in connection with the embodiments. For example, if the object of the invention is achieved and the advantages of the invention are attained even after some of the structural elements disclosed in connection with the embodiment are deleted, the structure made up of such structural elements can be extracted as an invention.

What is claimed is:

1. An analog-to-digital conversion apparatus comprising:
circuit sets, each circuit set including a selection circuit configured to select and output one of three or more analog signals input into the selection circuit, and including an analog-to-digital converter configured to convert an analog signal output from the selection circuit to digital data by sampling the analog signal output from the selection circuit at sampling times, the circuit sets being fewer in number than the analog signals input into the selection circuits of the circuit sets; and
a controller,
the controller being configured to execute:
a first control processing that causes the selection circuit of each of the circuit sets to cyclically switch which analog signal of the three or more input analog signals is selected at sampling times separated by a predetermined time difference to obtain sampled digital data items, and
a second control processing that calculates a predicted digital data item, at a reference sampling time corresponding to a sampling time of the sampled digital data items, for each of the analog signals output from at least one of the selection circuits of the circuit sets based on at least two digital data items obtained from different analog-to-digital converters of the circuit sets, and in accordance with the reference sampling time, and a time difference between the reference sampling time and the sampling time of at least one of the at least two digital data items.

2. The analog-to-digital conversion apparatus according claim 1, wherein
the controller is configured to further execute setting processing to set condition information including at least one of: an upper limit value and a lower limit value, a variation cycle, and a maximum degree of change per unit time for at least one of the analog signals output from the selection circuit, and the second control processing includes calculating the predicted digital data item at the reference sampling time for the analog signal output from the selection circuit for which the condition information is set by the setting processing, using the set condition information.

3. An analog-to-digital conversion method applicable to an analog-to-digital conversion apparatus including circuit sets, each circuit set including a selection circuit configured to select and output one of three or more input analog signals input into the selection circuit, and an analog-to-digital converter configured to convert an analog signal output from the selection circuit to digital data by sampling the analog signal output from the selection circuit at sampling times, the circuit sets being fewer in number than the analog signals input into the selection circuits of the circuit sets, the method comprising:

a first control processing that causes the selection circuit of each of the circuit sets to cyclically switch which analog signal of the three or more input analog signals is selected at sampling times separated by a predetermined time difference to obtain sampled digital data items, and a second control processing that calculates a predicted digital data item, at a reference sampling time corresponding to a sampling time of the sampled digital data items, for each of the analog signals output from at least one of the selection circuits of the circuit sets based on at least two digital data items obtained from different analog-to-digital converters of the circuit sets, and in accordance with the reference sampling time, and a time difference between the reference sampling time and the sampling time of at least one of the at least two digital data items.

4. The analog-to-digital conversion method according claim 3, further comprising setting processing to set condition information including at least one of: an upper limit value and a lower limit value; a variation cycle; and a maximum degree of change per unit time for at least one of the analog signals output from the selection circuit, wherein the second control processing includes calculating the predicted digital data item at the reference sampling time for the analog signal output from the selection circuit for which the condition information is set by the setting processing, using the set condition information.

5. A non-transitory computer-readable storage medium having a program stored thereon which controls a computer of an analog-to-digital conversion apparatus including circuit sets, each circuit set including a selection circuit configured to select and output one of three or more input analog signals input into the selection circuit, and an analog-to-digital converter configured to convert an analog signal output from the selection circuit to digital data by sampling the analog signal output from the selection circuit at sampling times, the circuit sets being fewer in number than the analog signals input into the selection circuits of the circuit sets, to perform functions comprising:

a first control processing that causes the selection circuit of each of the circuit sets to cyclically switch which analog signal of the three or more input analog signals is selected at sampling times separated by a predetermined time difference to obtain sampled digital data items, and a second control processing that calculates a predicted digital data item, at a reference sampling time corresponding to a sampling time of the sampled digital data items, for each of the analog signals output from at least one of the selection circuits of the circuits sets based on at least two digital data items obtained from different analog-to-digital converters of the circuit sets, and in accordance with the reference sampling time, and a time difference between the reference sampling time and the sampling time of at least one of the at least two digital data items.

6. The non-transitory computer-readable storage medium according to claim 5, wherein the functions further comprise setting processing to set condition information including at least one of: an upper limit value and a lower limit value; a variation cycle; and a maximum degree of change per unit time for at least one of the analog signals output from the selection circuit, and wherein the second control processing includes calculating the predicted digital data item at the reference sampling time for the analog signal output from the selection circuit for which the condition information is set by the setting processing, using the set condition information.

* * * * *